US010282494B2

(12) United States Patent
Mardikar et al.

(10) Patent No.: US 10,282,494 B2
(45) Date of Patent: May 7, 2019

(54) MODELING AND SIMULATION OF INFRASTRUCTURE ARCHITECTURE FOR BIG DATA

(71) Applicant: Tata Consultancy Services Limited, Mumbai (IN)

(72) Inventors: Nandkishor Janardan Mardikar, Mumbai (IN); Sameer Deshpande, Thane (IN); Kanaga Ganesan, Mumbai (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 679 days.

(21) Appl. No.: 14/711,743

(22) Filed: May 13, 2015

(65) Prior Publication Data

US 2016/0162611 A1 Jun. 9, 2016

(30) Foreign Application Priority Data

Dec. 8, 2014 (IN) .......................... 3930/MUM/2014

(51) Int. Cl.
*G06F 17/50* (2006.01)
*G06Q 10/06* (2012.01)
*G06Q 10/10* (2012.01)

(52) U.S. Cl.
CPC ..... *G06F 17/5009* (2013.01); *G06Q 10/06315* (2013.01); *G06Q 10/10* (2013.01)

(58) Field of Classification Search
CPC .......... G06F 17/5009; G06Q 10/06315; G06Q 10/10

USPC .......................................................... 703/22
See application file for complete search history.

(56) References Cited

PUBLICATIONS

Yuri Demchenko et. al., Defining Architecture Components of the Big Data Ecosystem, 2014 IEEE, 104-112.*
Alexander Alexandrov et. al., The Stratosphere platform for big data analytics, The VLDB Journal (2014) 23:939-964.*
Oracle, Oracle Endeca information Discover: A Technical Overview, An Oracle White Paper, Jan. 2014, 1-28.*
Alfredo Cuzzocrea et. al., Analytics over Large-Scale Multidimensional Data: The Big Data Revolution!, DOLAP'11, Oct. 28, 2011, Glasgow, Scotland, UK., p. 101-103.*
Min Chen et. al., Big Data: A Survey, Mobile Netw Appl (2014) 19:171-209.*

(Continued)

*Primary Examiner* — Aniss Chad
*Assistant Examiner* — Justin C Mikowski
(74) *Attorney, Agent, or Firm* — Workman Nydegger (57) ABSTRACT

Embodiments for modeling and simulation of one or more architecture models for Big Data of an organization are described. In one example, at least one user requirement and set of model requirements are received from a user associated with the organization, where the set of model requirements is indicative of information relating to the one or more architecture models. Subsequently, one or more architecture models are generated for providing recommendation to the user, where the one or more architecture models are generated based on the at least one user requirement and the set of model requirements. Further, the one or more architecture models are simulated to ascertain performance of each of the one or more architecture models based at least on a predefined specification of architecture components associated with each of the one or more architecture models.

17 Claims, 2 Drawing Sheets (56) References Cited

PUBLICATIONS

C.L. Philip Chen et. al., Data-intensive applications, challenges, techniques and technologies: A survey on Big Data, Information Sciences 275 (2014) 314-347.*

Kapil Bakshi, Considerations for Big Data: Architecture and Approach, 2012 IEEE, 1-7.*

Oracle, Accelerate Big Data Adoption with Less Risk and Complexity, PowerPoint presentation, Published in—2012, pp. 1-52.

Mardikar, Nandkishor, Big Data Adoption—Infrastructure Considerations, version 1.0, Tata Consultancy Services, pp. 1-13.

Big Data Adoption—Infrastructure Angle, publication, pp. 1-3.

* cited by examiner

MODELING AND SIMULATION OF INFRASTRUCTURE ARCHITECTURE FOR BIG DATA

CROSS-REFERENCE TO RELATED APPLICATIONS

This application claims priority to and the benefit of Indian Patent Application No. 3930/MUM/2014, entitled "Modeling and Simulation of Infrastructure Architecture for Big Data", filed on Dec. 8, 2014, which is incorporated by reference herein in its entirety.

TECHNICAL FIELD

The present subject matter relates, in general, to modeling of architecture and, in particular, to modeling and simulation of infrastructure architecture for Big Data of an organization.

BACKGROUND

In recent years, organizations have seen substantial growth in data volume. Continuous collection of large datasets that record information, such as customer interactions, product sales, results from advertising campaigns on the Internet by organizations, data coming from social media and mobile devices, etc. has led to a substantial growth in data volume. Many organizations today are facing tremendous challenges in managing the data due to the sudden growth in data volume, and also the unstructured nature of data. Consequently, storage and analysis of large volumes of data have emerged as a challenge for many enterprises, both big and small, across all industries.

In recent years, Big data technologies, such as Hadoop and NoSQL, have been widely adopted due to its capability of handling large sets of structured as well as unstructured data. The Hadoop is an open source technology for distributed computing with massive data sets using a cluster of multiple nodes. The Hadoop includes a Hadoop Distributed File System (HDFS) as a data storage layer and a Hadoop MapReduce framework as a data processing layer. Further, NoSQL is a technology to address new challenges of flexible schema needed for unstructured data and several other constraints associated with traditional database management systems, such as relational database management system (RDBMS).

BRIEF DESCRIPTION OF THE DRAWINGS

The detailed description is described with reference to the accompanying figure(s). In the figure(s), the left-most digit(s) of a reference number identifies the figure in which the reference number first appears. The same numbers are used throughout the figure(s) to reference like features and components. Some embodiments of systems and/or methods in accordance with embodiments of the present subject matter are now described, by way of example only, and with reference to the accompanying figure(s), in which.

DETAILED DESCRIPTION

With the advent of technology, increase in growth in volume of data being generated, and the unstructured nature of data, organizations are adopting Big Data frameworks to store and analyze the large volume of data. Owing to the continuous increase in the amount of data, one of the biggest challenges faced by the organizations today involves efficiently and effectively storing and processing the data at optimum cost. Many organizations are neither well informed nor equipped to determine which Big Data framework they should adopt for storing their data. For instance, organizations may not perform substantial research to determine whether they should adopt a Big Data technology, such as Hadoop, a NoSQL technology, or a combination of the Big Data technology and the NoSQL technology for storing and analyzing data.

Further, at present, the organizations while storing the data, take into account only an application perspective and not an infrastructure perspective. For example, while adopting a Big Data technology, such as Hadoop, organizations may not take into consideration the infrastructure design of a data storage cluster of the Big Data framework. In case the data storage cluster is not well designed, a MapReduce algorithm of the Hadoop may not be able to produce outputs efficiently.

In accordance with the present subject matter, a system and a method for modeling and simulation of infrastructure architecture for Big Data of an organization are described. In one example, the infrastructure architecture may pertain to a Big Data framework, such as a Big Data technology, for example, Hadoop, a NoSQL technology, or a combination of the Big Data technology and the NoSQL technology. According to the present subject matter, the modeled infrastructure architecture may be recommended to an organization for implementation within the organization.

According to an implementation, at least one user requirement is received from a user associated with the organization. In one example, the user may be a customer or an end user of the infrastructure architecture models, such as an Information Technology (IT) head of the organization. Examples of the at least one user requirement include, but are not limited to, a domain of the organization, one or more use cases pertaining to the domain of the organization, a deployment environment for deployment of the infrastructure architecture, an amount of data to be stored, a composition of the data, and a method of feeding the data.

In an example, the domain of the organization may be a manufacturing domain, an E-commerce domain, a healthcare domain, and the like. Further, each domain of the organization may be associated with one or more use cases. In one example, if a domain of an organization is a manufacturing domain, then use cases pertaining to the organization may be machine learning. Further, examples of the deployment environment for deployment of the infrastructure architecture include a bare-metal deployment environment, a virtualized deployment environment, and a cloud deployment environment. The composition of the data may be one of a structured composition and an unstructured composition, and a method of feeding the data may be one of a batch-oriented feed, a near-real-time feed, and a stream feed.

Thereafter, based on the at least one user requirement, a suitable Big Data framework may be determined for adoption by the organization. In one example, the Big Data framework may correspond to one of Big Data technology, such as Hadoop, NoSQL technology, and a combination of the Big Data technology and the NoSQL. Subsequently, a visual model of the infrastructure architecture is generated. The infrastructure architecture includes at least one of a cluster architecture model, a network architecture model, a storage architecture model, and an information security architecture model.

For generation of the cluster architecture model, at least one cluster requirement is received from the user. The at least one cluster requirement is indicative of information relating to a cluster and a hardware. The cluster architecture model may be generated based on the at least one cluster requirement and at least one architecture pattern. Further, for generation of the network architecture model, at least one network requirement is received from the user. The at least one network requirement is indicative of information relating to a network. Thereafter, based on the at least one network requirement and the cluster architecture model, the network architecture model may be generated.

Likewise, the storage architecture model is generated based on at least one storage requirement received from the user, the cluster architecture model, and the network architecture model. Further, the information security model is generated based on at least one security requirement received from the user, the cluster architecture model, the network architecture model, and the storage architecture model.

According to an implementation, each of the cluster architecture model, the network architecture model, the storage architecture model, and the information security architecture model may be simulated to ascertain performance of each of the cluster architecture model, the network architecture model, the storage architecture model, and the information security architecture model based on specification of architecture components corresponding to each architecture model. Further, a cost associated with each of the cluster architecture model, the network architecture model, the storage architecture model, and the information security model may be calculated based on a price of each architectural component corresponding to each architecture model.

Once the cluster architecture model, the network architecture model, the storage architecture model, and the information security architecture model are generated, and performance and cost of each architecture model is estimated, an operator, such as an architect may recommend the generated architecture models to the user for implementation within the organization. It would be understood that the operator may be different from the user. Further, the architecture models may also be rendered to the user for customization according to requirement of the user.

Although, it has been described that the infrastructure architecture may be modeled for implementation within the organization, according to one implementation, the infrastructure architecture may be modeled for the organization even if an architecture is already deployed within the organization. In such a case, the modeled infrastructure architecture may be analyzed in comparison to the deployed architecture. The deployed architecture may then be optimized based on the analysis.

According to the present subject matter, since requirements of the user are holistically captured, optimum infrastructure architecture is modeled based on need of the user. Further, once the infrastructure architecture is modelled and recommended to the user, the user may customize the infrastructure architecture depending upon need. Thus, since the user is able to customize the infrastructure architecture before implementing the infrastructure architecture within the organization, the user does not have to spend time and effort in modifying the infrastructure architecture after the infrastructure architecture has been implemented. Also, the user does not incur cost in procuring unwanted infrastructure components. Thus, according to the present subject matter, the modeling and simulation of the infrastructure architecture and implementation of the infrastructure architecture for Big Data within the organization is efficient in terms of time consumed, cost, resources, and performance.

The following disclosure describes a system and a method for modeling of and simulation of infrastructure architecture for Big Data. While aspects of the described system and method can be implemented in any number of different computing systems, environments, and/or configurations, embodiments for modeling and simulation of the infrastructure architecture are described in the context of the following exemplary system(s) and method(s).

Figure 1:
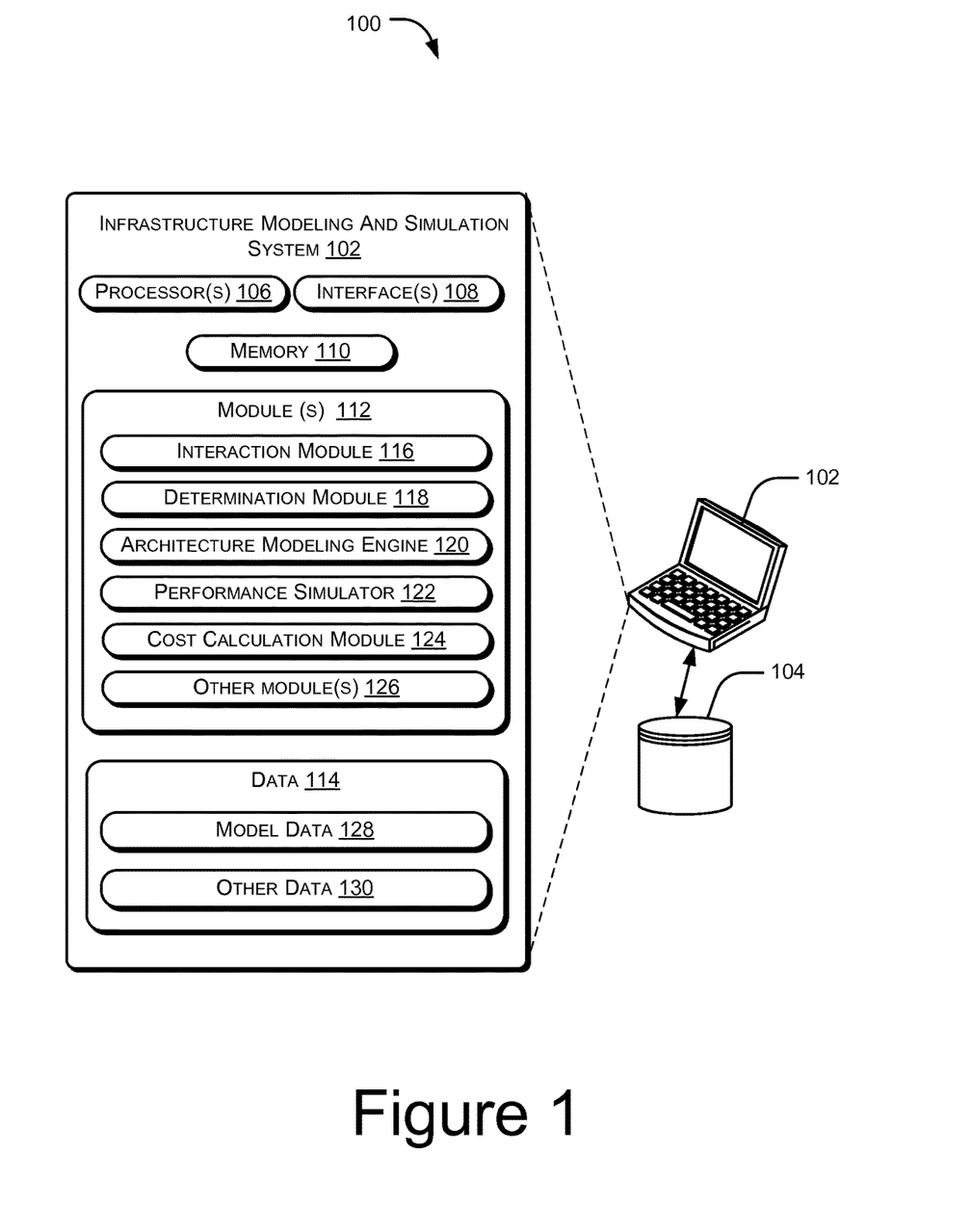
FIG. 1 illustrates an environment implementing an infrastructure modeling and simulation system, according to an embodiment of the present subject matter.

FIG. 1 illustrates an environment 100 implementing an infrastructure modeling and simulation system 102, according to an embodiment of the present subject matter.

In an implementation, the infrastructure modeling and simulation system 102 is provided for recommending infrastructure architecture to an organization for implementation of the infrastructure architecture for Big Data within the organization. In one example, the infrastructure architecture may pertain to a Big Data framework, such as a Big Data technology, for example Hadoop, a NoSQL technology, or a combination of the Big Data technology and the NoSQL technology.

In one implementation, the network environment 100 can be a public network environment, including thousands of personal computers, laptops, various servers, such as blade servers, and other computing devices. In another implementation, the network environment 100 can be a private network environment with a limited number of computing devices, such as personal computers, servers, and laptops.

The infrastructure modeling and simulation system 102 may be implemented in a variety of computing systems, such as a laptop computer, a desktop computer, a notebook, a workstation, a mainframe computer, a server, a network server, and the like. In one implementation, the infrastructure modeling and simulation system 102 is communicatively coupled with a database 104. In one example, the infrastructure modeling and simulation system 102 may be communicatively coupled to the database 104 with a network or local access on the computing system. The database 104 may store data that is utilized by the infrastructure modeling and simulation system 102 for generation of the infrastructure architecture. In one example, the data contained within the database 104 may be periodically updated. For example, new data may be added into the database, existing data may be modified, or non-useful data may be deleted from the database 104.

According to an implementation, the infrastructure modeling and simulation system 102 includes processor(s) 106, interface(s) 108, and memory 110 coupled to the processor(s) 106. The processor(s) 106 may be implemented as one or more microprocessors, microcomputers, microcontrollers, digital signal processors, central processing units, state machines, logic circuitries, and/or any devices that manipulate signals based on operational instructions. Among other capabilities, the processor(s) 106 may be configured to fetch and execute computer-readable instructions stored in the memory 110.

The memory 110 may include any computer-readable medium known in the art including, for example, volatile memory, such as static random access memory (SRAM), and dynamic random access memory (DRAM), and/or non-volatile memory, such as read only memory (ROM), erasable programmable ROM, flash memories, hard disks, optical disks, and magnetic tapes.

Further, the interface(s) 108 may include a variety of software and hardware interfaces, for example, interfaces for peripheral device(s), such as a product board, a mouse, an external memory, and a printer. Additionally, the interface(s) 108 may enable the infrastructure modeling and simulation system 102 to communicate with other devices, such as web servers and external repositories.

The infrastructure modeling and simulation system 102 also includes module(s) 112 and data 114. The module(s) 112 include, for example, an interaction module 116, a determination module 118, an architecture modeling engine 120, a performance simulator 122, a cost calculation module 124, and other module(s) 126. The other modules 126 may include programs or coded instructions that supplement applications or functions performed by the infrastructure modeling and simulation system 102. The data 114 may include model data 128 and other data 130. In one example, the model data 128 may include data relating to the infrastructure architecture. Further, the other data 130, amongst other things, may serve as a repository for storing data that is processed, received, or generated as a result of the execution of one or more modules in the module(s) 112.

Although the data 114 is shown internal to the infrastructure modeling and simulation system 102, it may be appreciated by a person skilled in the art that the data 114 can also be implemented external to the infrastructure modeling and simulation system 102, wherein the data 114 may be stored within the database 104 communicatively coupled to the infrastructure modeling and simulation system 102.

In one embodiment of the present subject matter, for the purpose of recommending the infrastructure architecture to the organization, an operator may launch the infrastructure modeling and simulation system 102 on a communication device, for example, a laptop using login credentials. The operator may be an architect who is to recommend the infrastructure architecture for Big Data to the organization for implementation. In one example, the login credentials may include a user identifier and a user password.

Thereafter, the interaction module 116 of the infrastructure modeling and simulation system 102 may receive at least one user requirement from a user associated with the organization. In an example, the user may be an Information Technology (IT) head of the organization. Further, examples of the at least one user requirement include, but are not limited to, a domain of the organization, one or more use cases pertaining to the domain of the organization, a deployment environment for deployment of the infrastructure architecture, an amount of data to be stored, a composition of the data, and a method of feeding the data.

In an example, the domain of the organization may be a manufacturing domain, an E-commerce domain, a healthcare domain, and the like. Further, each domain of the organization may be associated with one or more use cases. In one example, if a domain of an organization is a manufacturing domain, then use cases pertaining to the organization may be machine learning. In said example, the organization may generate massive amount of data from various machine components. However, as structure of the data and schemas change continuously, the organization may not be able to utilize the data to gain insight into network performance. In another example, if a domain of an organization is an E-commerce domain, then a use case may be pre-launch market survey of a product or set of products. In yet another example, if a domain of an organization is a healthcare domain, then a use case may be efficient drug discovery by analyzing complex drug interactions and outcome analysis.

Moreover, examples of the deployment environment for deployment of the infrastructure architecture for Big Data include a bare-metal deployment environment, a virtualized deployment environment, and a cloud deployment environment. Further the composition of the data may be one of a structured composition and an unstructured composition, and a method of feeding the data may be one of a batch-oriented feed, a near-real-time feed, and a stream feed.

Thereafter, the determination module 118 may determine a suitable Big Data framework based on the at least one user requirement. In an implementation, the determination module 118 may recommend the Big Data framework to the user. Further, the determination module 118 may also recommend a suitable product to the user corresponding to the determined Big Data framework. In one example, the operator may recommend the Big Data framework to the user for deployment within the organization. In one example, the Big Data framework may correspond to one of a Big Data technology, such as Hadoop, a NoSQL technology, and a combination of the Big Data technology and the NoSQL technology. The MapReduce algorithm of Hadoop is for batch-oriented workload, i.e., the MapReduce is not suitable for real-time data processing and analysis, while the NoSQL provides schema-less or Fluid schema data storage and Query mechanism.

Accordingly, if a domain of an organization is an E-commerce domain and a corresponding use case is to analyze consumer market interest or behavior, then the determination module 118 may determine the Big Data framework to be NoSQL technology alone. Further, in case a domain of an organization and a corresponding use case are such that both batch-oriented processing of data and flexible schema for the data are required, then the determination module 118 may determine the Big Data framework to be a combination of the Big Data technology and the NoSQL technology. Also, the determination module 118 may model and simulate existing Big Data framework within an organization. The determination module 118 may identify a plurality of characteristics of an existing cluster and feed the plurality of characteristics in the architecture modeling engine 120.

Subsequently, the architecture modeling engine 120 of the infrastructure modeling and simulation system 102 may generate a visual model of the infrastructure architecture for providing recommendation to the user. The infrastructure architecture may include at least one of a cluster architecture model, a network architecture model, a storage architecture model, and an information security architecture model. In one example, the cluster architecture model, the network architecture model, the storage architecture model, and the information security architecture model may be three-dimensional (3D) models. According to an implementation, the architecture modeling engine 120 may receive a set of model requirements from the user. The set of model requirements may be indicative of information relating to each of the cluster architecture model, the network architecture model, the storage architecture model, and the information security architecture model. According to an example, the set of model requirements may include at least one cluster requirement, at least one network requirement, at least one storage requirement, and at least one security requirement.

According to an implementation, the architecture modeling engine 120 may define characteristics of one or more hardware or infrastructure products, such as servers, network switches, storage devices, and the like for generating the model of the infrastructure architecture, simulating the infrastructure architecture to ascertain performance of the infrastructure architecture, and calculating a cost associated with the infrastructure architecture. Further, the architecture modeling engine 120 may also adapt new one or more hardware or infrastructure products for generating the model of the infrastructure architecture, simulating the infrastructure architecture to ascertain performance of the infrastructure architecture, and calculating a cost associated with the infrastructure architecture.

In an implementation, for generation of the cluster architecture model, the architecture modeling engine 120 may receive the at least one cluster requirement from the user. Further, the architecture modeling engine 120 may retrieve at least one architecture pattern from the database 104. The at least one cluster requirement is indicative of information relating to cluster and hardware. Further, examples of the at least one cluster requirement include, but are not limited to, an expected growth rate of data, a number of data sources, and input/output bandwidth. Furthermore, examples of the at least one architecture pattern include, but are not limited to, a workload pattern and a resource utilization matrix. The workload pattern is indicative of information relating to a number of jobs, a type of job, and a frequency of job. Further, the resource utilization matrix includes processor utilization for master and slave, network utilization, security specific overheads, etc.

Subsequently, based on at least one user requirement, at least one cluster requirement, and at least one architecture pattern, the architecture modeling engine 120 generates the visual model of the cluster architecture. Therefore, for generation of the cluster architecture model, the architecture modeling engine 120 captures inputs, such as data volume, data velocity, and data replication factor. Further, available pattern definition for the given range of data inputs is applied to arrive at optimum hardware specifications, such as disk size, number of CPUs, number of core per CPU, RAM for master and slave nodes. Thereafter, a cluster size is calculated to determine a number of cluster nodes. In an implementation, the number of cluster nodes may be calculated based on the below equation:

$$\text{Number of cluster nodes} = (\text{Data Volume} * \text{Data Velocity} * \text{Data Replication Factor}) / \text{Disk Size} \quad (1)$$

Disk Size in above equation indicates the recommended storage space for a cluster node in bare-metal or virtual or cloud environment.

According to an implementation, the architecture modeling engine 120 may visually represent the cluster architecture model by getting a top center coordinates of a draw panel. Thereafter, the architecture modeling engine 120 may draw name node(s) at the top center of the draw panel and a job tracker below the name node(s). Further, the architecture modeling engine 120 may decide on a number of racks based on the number of nodes per rack and co-ordinates of the first rack is taken considering 10 racks per row based on the size of each rack and spacing between racks. Subsequently, if the node is present and has properties set, then the architecture modeling engine 120 may fill the rack node slot with a first color and if the node is present but properties have not been set, then the architecture modeling engine 120 may fill the rack node with a second color. Further, if there is no node in a slot, then the architecture modeling engine 120 may fill the rack node with a default color. In one example, the first color is a green color, the second color is an orange color, and the default color is a grey color. Subsequently, the architecture modeling engine 120 may connect the name node(s) or the job tracker(s) to every rack in the draw panel. When an operator clicks on a node, using an input device, such as a mouse, a pop up window appears through which the user can see or edit the properties for that node. Further, the operator may click on a save button to save the displayed cluster architecture model with a name of the user and a project name.

The cluster architecture model depicts an initial size of the cluster and hardware specifications for master and slave nodes of the cluster. Further, the architecture modeling engine 120 may store the cluster architecture model in the model data 128 of the data 114.

According to an implementation, for generation of the network architecture model, the architecture modeling engine 120 may receive the at least one network requirement from the user. The at least one network requirement is indicative of information relating to a network. Examples of the at least one network requirement include, but are not limited to, network resiliency, burst handling and queue depth, network scalability, network capacity, and network latency.

Thereafter, based on the at least one network requirement and the cluster architecture model, the architecture modeling engine 120 generates the network architecture model. The network architecture model depicts a network topology, i.e., whether it is a star topology, a double rack topology, a tree topology, or a DCell topology. The network architecture model may also depict a specification of each network component present in the network architecture model, uplink and downlink bandwidth, and a networking protocol. In an example, the generated network architecture model may be scalable to a large number of servers and be fault tolerant against various types of network component failure, link outages, server-rack failures, and the like.

According to an implementation, for generating the network architecture model, the architecture modeling engine 120 may decide on the network topology based on the total data volume. In one example, if a number of nodes is less than equal to 16, then the star topology may be taken into consideration. In another example, if the number of nodes is less than equal to 32, then the double rack topology may be taken into consideration. In yet another example, if the number of nodes is less than equal to 64, then tree topology may be taken into consideration. In yet another example, if the number of nodes is greater than 64, then DCell topology may be taken into consideration. Thereafter, the architecture modeling engine 120 may create a visual model of the network architecture based on the network topology. For instance, in case of star topology, the architecture modeling engine 120 may draw a core switch in the top center of the draw panel. For the double rack topology, the architecture modeling engine 120 may draw two core switches by getting the co-ordinates with respect to top center of the draw panel. Similarly, for the tree topology, the architecture modeling engine 120 may draw the core switch in the top center of the draw panel. Thereafter, the architecture modeling engine 120 may get a level of tree structure based on the number of nodes and draw the subsequent level core switches. Further, the architecture modeling engine 120 may get the co-ordinates for the rack switches based on the size and space between each rack switch. Subsequently, the architecture modeling engine 120 may draw racks right below each rack switch and connect each rack with its rack switch, and further connect the core switch(es) with all the rack switches.

The DCell-based solution includes various components, such as DCell scalable network structure, efficient and distributed routing algorithm, fault-tolerant routing for addressing different types of failures, for example, link/server failures, a scheme that allows for a gradual increase in a size of the DCell Network. Further, for DCell topology, the architecture modeling engine 120 may get the information of a number of DCells and a number of nodes per Dcell. A high-level DCell is constructed from low-level DCells. DCell0 is the building block to construct larger DCells. It has n servers and a mini-switch (say n=4 for DCell0). All servers in DCell0 are connected to the mini-switch. A level-1 DCell1 is constructed using n+1 DCell0s. In DCell1, each DCell0 is connected to all the other DCell0s with one link. And so on.

Thereafter, the architecture modeling engine 120 may draw rack switches by getting the co-ordinates considering a polygon with sides equal to a number of DCells from the top center of draw panel. Further, the architecture modeling engine 120 may draw the number of nodes per DCell by getting the co-ordinates from the DCell switch or rack switch. The architecture modeling engine 120 may then get the properties of the corresponding nodes from the particular cluster architecture model and populate there. Based on the data volume per node, the architecture modeling engine 120 may decide on the network cable bandwidth and its type. In an example, the operator may not be able to edit the properties of the nodes. However, the operator may be able to edit the properties of the network link and switches.

The network architecture model may also provide adequate network capacity to support necessary bandwidth. Further, the architecture modeling engine 120 may store the network architecture model in the model data 128 of the data 114.

In an implementation, for generation of the storage architecture model, the architecture modeling engine 120 may receive the at least one storage requirement from the user. The at least one storage requirement is indicative of information relating to storage devices deployed in the organization or storage devices to be deployed in the organization. Examples of the at least one storage requirement include, but are not limited to, re-use of the storage devices, such as Storage Area Network (SAN) and Network Attached Storage (NAS), in addition to DAS (Direct attached storage) or without DAS, and reduction of power consumption by the storage devices.

Subsequently, based on the at least one storage requirement, the cluster architecture model, and the network architecture model, the architecture modeling engine 120 may generate the storage architecture model. According to an implementation, to generate the storage architecture model, the architecture modeling engine 120 may draw the basic cluster architecture model by getting inputs from the corresponding saved cluster architecture model. In one example, if only DAS is to be deployed in the organization, then the architecture modeling engine 120 may insert a disk inside every node. Further, the operator may add additional disks by dragging and dropping the disk component from the components panel. In another example, if DAS with SAN is to be deployed in the organization, then in addition to DAS, the architecture modeling engine 120 may draw a SAN component at the bottom center of the draw panel. Further, the architecture modeling engine 120 may draw a SAN switch or a FC Switch below each rack and then connect all the FC switches to the SAN component. In yet another example, if only SAN is to be deployed in the organization, then the architecture modeling engine 120 may remove the DAS and keep only the SAN.

In one example, if the user specifies that the user wishes to re-use existing storage devices, such as SAN and NAS, then the architecture modeling engine 120 may generate the storage architecture model taking into consideration the SAN and NAS storage devices, further it may be used as Primary or Secondary storage mechanism. In another example, if the user does not want to re-use the SAN and NAS storage devices, then the architecture modeling engine 120 may generate the storage architecture model based on DAS only. Also, by using the storage architecture model, performance and efficiency of the storage system may improve. Further, overall cluster efficiency and utilization of storage devices is improved, and power consumption is reduced. In an implementation, the architecture modeling engine 120 may store the storage architecture model in the model data 128 of the data 114.

According to an implementation, for generation of the information security model, the architecture modeling engine 120 may receive at least one security requirement from the user. The at least one security requirement is indicative of information relating to security of data of the organization. Examples of the at least one security requirement include, but are not limited to, authentication and authorization while accessing data and a security level for the data. The security level may indicate a level of security that the user wants for each type of the data. In one example, the security level may be one of a low security level, a medium security level, and a high security level.

Further, based on the at least one security requirement, the cluster architecture model, the network architecture model, and the storage architecture model, the architecture modeling engine 120 may generate the information security architecture model. The security architecture model may provision various mechanisms including but not limited to data security, infrastructure security, and technology security. The security architecture model is generated by means of visual depiction of each of the security specific infrastructure component. In an example, the user may choose the level of security desired. This choice is applied to the architecture pattern applicable. Based on the user's choice, relevant security mechanism gets activated. In one example, the information security architecture model may be able to address a security threat to the data stored within the cluster. The information security architecture model may identify sensitive information in the data and may accordingly apply a security level on the information. Further, the information security architecture model may create permissions to access the data. Moreover, the information security architecture model may encrypt the data and implement secure communication between the cluster and applications.

Once the cluster architecture model, the network architecture model, the storage architecture model, and the information security architecture model, collectively referred to as architecture models and individually referred to as architecture model, are generated, the architecture modeling engine 120 may display the cluster architecture model, the network architecture model, the storage architecture model, and the information security architecture model on a screen of the computing device. The operator may recommend the generated architecture models to the user for implementation within the organization. In one implementation, the operator may customize the architecture models. In another implementation, the user may also customize the architecture models according to his need.

For customization of the architecture models, the architecture modeling engine 120 may retrieve one or more pre-defined graphical icons pertaining to each of the cluster architecture model, the network architecture model, the storage architecture model, and the information security architecture model from the database 104. The one or more pre-defined graphical icons are visual icons that can be dragged and dropped by the user on to the screen of the computing device. The user may customize the architecture models using the graphical icons according to his need. In one example, if the user wishes to change the network topology of the network architecture model, the user may edit the network architecture model by dragging and dropping graphical icons that illustrate the desired network topology. Moreover, the architecture models also indicate specification of each architecture component present in the architecture models. In one example, the specification of each architecture component may be pre-stored in the database 104. Also, the user or the operator may print the architecture models using a local or a network printer. Further, the architecture models may also be exported to readable formats, such as '.pdf'.

Thereafter, the performance simulator 122 may simulate each of the cluster architecture model, the network architecture model, the storage architecture model, and the information security architecture model to ascertain performance of each of the cluster architecture model, the network architecture model, the storage architecture model, and the information security architecture model based on the pre-defined specification of architecture components corresponding to each architecture model and a workload pattern. For a given mix of jobs and frequency of jobs, the end-to-end performance of MapReduce can be determined and virtually simulated. In one example, the performance of each of the models may be based on a deployment environment. For example, for a bare-metal deployment environment, information relating to a number of CPU, a number of cores per CPU, CPU speed, and RAM may be obtained from the cluster architecture model. Further, from the network architecture model, information relating to a number of ports, uplink and downlink speed of core and rack switches, and network link between nodes may be obtained.

Subsequently, information relating to a number of disks, disk size, and disk read and write may be obtained from the storage architecture model. Further, the operator may define a number of mappers and reducers per node, job characteristics, a number of files, and average file size and replication factor. The architecture modeling engine 120 may then create a topology by parsing the xml files and total data volume per chunk size. The chunks are distributed to the nodes considering factors, such as the local nodes, rack local, and rack remote nodes. Further, the defined CPU cycles per byte parameter for each phase of simulation based on type of job. Thereafter, a scheduler is defined and each job is divided into map and reduce tasks. Further, heartbeat messages are scheduled between namenode and other nodes. The architecture modeling engine 120 may then start jobs at random time and schedule the tasks based on the load on each node. Subsequently, network distance for local node is defined between nodes from same rack, nodes from adjacent racks, and other nodes. Thereafter, units, for example, CPU cycles per byte multiplied by chunk size, are converted for the particular phase to time and appended to specific counters. Further, the statistics may be generated for each phase and graphs may be plotted in the draw panel.

Similarly, for a virtualized deployment environment, information relating to a number of virtual machines per physical machines, a number of CPU, a number of cores per CPU, CPU speed, and RAM may be obtained from the cluster architecture model. Further, from the network architecture model, information relating to a number of ports, uplink and downlink speed of core and rack switches, and network bandwidth between nodes may be obtained.

Subsequently, information relating to a number of disks, disk size, and disk read and write may be obtained from the storage architecture model. Further, the operator may define a number of mappers and reducers per node, job characteristics, a number of files, and average file size and replication factor. The architecture modeling engine 120 may then create a topology by parsing the xml files and total data volume per chunk size. The chunks are distributed to the nodes considering factors, such as the local nodes, machine local, rack local, and rack remote nodes. In an example, two replicas are not placed on the different nodes from the same machine. Further, the defined CPU cycles per byte parameter for each phase of simulation based on type of job. Thereafter, a scheduler is defined and each job is divided into map and reduce tasks. Further, heartbeat messages are scheduled between namenode and other nodes, the additional network overhead due to virtualized deployment environment is also considered. The architecture modeling engine 120 may then start jobs in random time and schedule the tasks based on the load on each node. Subsequently, network distance for local node is defined between nodes from same physical machine, between nodes from same rack, nodes from adjacent racks, and other nodes. Thereafter, units, for example, CPU cycles per byte multiplied by chunk size, are converted for the particular phase to time and appended to specific counters. Further, the statistics may be generated for each phase and graphs may be plotted in the draw panel.

Similarly, for a cloud deployment environment, information relating to a number of virtual machines per physical machines, a number of CPU, a number of cores per CPU, CPU speed, and RAM may be obtained from the cluster architecture model. Further, from the network architecture model, information relating to a number of ports, uplink and downlink speed of core and rack switches, router characteristics, and network link between nodes may be obtained.

Subsequently, information relating to a number of disks, disk size, and disk read and write may be obtained from the storage architecture model. Further, the operator may define a number of mappers and reducers per node, job characteristics, a number of files, and average file size and replication factor. A router topology may also be generated. Further, the architecture modeling engine 120 may then create a topology by parsing the xml files and total data volume per chunk size. The chunks are distributed to the nodes. All nodes are rack remote here since every edge node is considered as a rack. Further, the defined CPU cycles per byte parameter for each phase of simulation based on type of job. Thereafter, a scheduler is defined and each job is divided into map and reduce tasks. Further, heartbeat messages are scheduled between namenode and other nodes, considering the router topology. The architecture modeling engine 120 may then start jobs at random time and schedule the tasks based on the load on each node. Subsequently, network distance is defined with randomness based on the router topology. Thereafter, units, for example, CPU cycles per byte multiplied by chunk size are converted for the particular phase to time and appended to specific counters. Further, the statistics may be generated for each phase and graphs may be plotted in the draw panel As previously mentioned, the workload pattern is indicative of information relating to a number of jobs, a type of job, and a frequency of job. In one example, security of data may contribute to performance overhead of the information security architecture model. The performance simulator 122 may simulate the performance of the information security architecture model for critical data security parameters needed by the user. According to an example, the performance simulator 122 may capture the user's choice and may retrieve one or more pre-defined reporting templates from the database 104 to demonstrate the performance of each of the architecture models. The performance simulator 122 may display the performance of each of the architecture models to the user using the pre-defined reporting templates. According to an implementation, the performance simulator 122 may adjust one or more parameters pertaining to each of the architecture models based on the simulated performance of each of the architecture models to arrive at an optimum configuration for a given set of requirements. Further, the performance simulator 122 may take into account trends in data, workload changes, and models the architecture models to efficiently serve the varying workload over time.

Further, the cost calculation module 124 may generate a bill of materials for each architecture model. A bill of materials for an architecture model may be generated based on cost associated with the architecture model. In one example, the cost may be calculated based on a price of each architectural component of the architecture model. In an example, the cost calculation module 124 may retrieve the price of each architectural component from the database 104. According to an implementation, the cost calculation module 124 may store the bill of materials of each architecture model in the model data 128.

According to an implementation, the user may customize the architecture models in order to bring variation in the performances and cost associated with architecture models. In one example, hardware specifications of architecture components of the cluster architecture model may impact overall performance of the cluster architecture model. Accordingly, the user may customize the performance of the cluster architecture model for critical hardware specifications. In said example, the user may select a set of suitable specifications for the critical hardware components In one example, if the user wants cost associated with the cluster architecture model to be further brought down by comprising performance of the cluster architecture model, the user may, with or without operator's consultation, customize the cluster architecture model accordingly. In another example, if the user wants to improve performance of the cluster architecture model, the user may customize the cluster architecture model, such that high-quality architecture components are used in the cluster architecture model.

Further, as described earlier, the interface 108 may enable the infrastructure modeling and simulation system 102 to communicate with other devices, such as web servers and external repositories. Thus, the infrastructure modeling and simulation system 102 may feed details of the architecture models to external systems or products for physical implementation of the architecture models. Also, the infrastructure modeling and simulation system 102 may be deployed as a standalone system or may be deployed on centralized infrastructure to be used by multiple users in as-a-service mode. In cases where the infrastructure modeling and simulation system 102 is used in as-a-service mode, the infrastructure modeling and simulation system 102 may have multi-tenancy support, where multiple users can use a same instance of the infrastructure modeling and simulation system 102 securely without any interference.

Further, although DAS storage device may be suitable for storing huge amount of data in a distributed computing deployment, however in some case, the organization may have invested heavily on NAS and SAN storage devices. Thus, the user may decide upon the primary and secondary storage devices and help simulate performance of the cluster for critical storage parameters chosen by the user or for all the storage parameters. As a result, storage cost is optimized. Further, disk utilization within the cluster is improved.

Thus, according to the present subject matter, visual infrastructure architecture for Big Data is presented to the user before the user makes an actual investment, thereby making it possible for the user to estimate initial cost and recurring cost associated with the infrastructure architecture. Also, the design of the one or more architecture models is flexible and modular with pluggable modules for various Big Data and NoSQL technologies. Accordingly, the infrastructure modeling and simulation system 102 may be adapted to adopt the Big Data and NoSQL technologies by deploying the corresponding pluggable modules. Thus, according to the present subject matter, the modeling of the infrastructure architecture and implementation of the infrastructure architecture within the organization is optimized in terms of time consumed, cost, resources, and performance.

Figure 2:
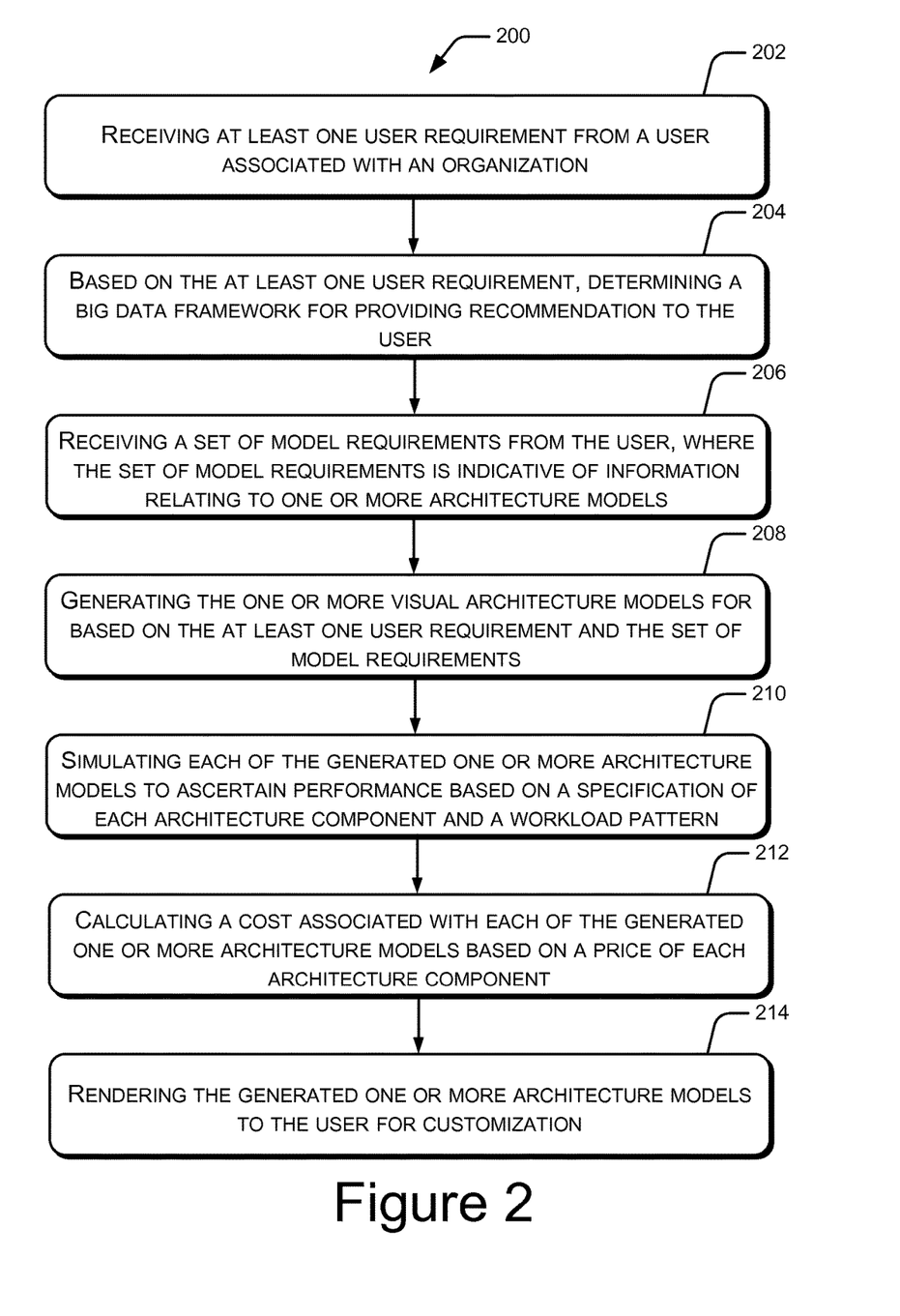
FIG. 2 illustrates a method for modeling and simulation of infrastructure architecture for Big Data of an organization, according to an embodiment of the present subject matter.

FIG. 2 illustrates a method 200 for modeling and simulation of infrastructure architecture for Big Data of an organization, according to an embodiment of the present subject matter. The method 200 may be described in the general context of computer executable instructions. Generally, computer executable instructions can include routines, programs, objects, components, data structures, procedures, modules, functions, etc., that perform particular functions or implement particular abstract data types. The method 200 may also be practiced in a distributed computing environment where functions are performed by remote processing devices that are linked through a communications network.

The order in which the method 200 is described is not intended to be construed as a limitation, and any number of the described method blocks can be combined in any order to implement the method 200, or an alternative method. Furthermore, the method 200 can be implemented in any suitable hardware, software, firmware or combination thereof.

At block 202, the method 200 includes receiving at least one user requirement from a user associated with an organization. Examples of the at least one user requirement include, but are not limited to, a domain of the organization, one or more use cases pertaining to the domain of the organization, a deployment environment for deployment of the infrastructure architecture, an amount of data to be stored, a composition of the data, and a method of feeding the data. In accordance with one implementation of the present subject matter, the interaction module 116 of the infrastructure modeling and simulation system 102 receives at least one user requirement from the user.

At block 204, the method 200 includes based on the at least one user requirement, determining a Big Data framework for providing recommendation to the user. In one example, an operator, such as an architect may recommend the Big Data framework to the user for deployment within the organization. In one example, the Big Data framework may correspond to one of the Big Data Technology, such as Hadoop, the NoSQL technology, and a combination of the Big Data technology and the NoSQL technology. In one implementation, the determination module 118 determines the Big Data framework for providing recommendation to the user.

At block 206, the method 200 includes receiving a set of model requirements from the user, where the set of model requirements is indicative of information relating to one or more architecture models. The one or more architecture models include a cluster architecture model, a network architecture model, a storage architecture model, and an information security architecture model. Further, the set of model requirements include at least one cluster requirement, at least one network requirement, at least one storage requirement, and at least one security requirement. In one implementation, the architecture modeling engine 120 receives a set of model requirements from the user At block 208, the method 200 includes generating the one or more visual architecture models based on the at least one user requirement and the set of model requirements. In one implementation, the architecture modeling engine 120 generates the one or more architecture models for based on the at least one user requirement and the set of model requirements.

At block 210, the method 200 includes simulating each of the generated one or more architecture models to ascertain performance based on a specification of each architecture component and a workload pattern. The workload pattern is indicative of information relating to a number of jobs, a type of job, and a frequency of job. The performances of the architecture models may be displayed to the user using the user's choice and the associated pre-defined reporting templates. In an implementation, the performance simulator 122 simulates each of the generated one or more architecture models to ascertain performance of each of the generated one or more architecture models.

At block 212, the method 200 includes calculating a cost associated with each of the generated one or more architecture models based on a price of each architecture component. According to an implementation, the cost calculation module 124 may generate a bill of materials for each architecture model. A bill of materials for an architecture model may be generated based on cost associated with the architecture model.

At block 214, the method 200 includes rendering the generated one or more architecture models to the user for customization. The user may customize the architecture models using the pre-defined graphical icons according to his need.

Although embodiments for methods and systems for modeling and simulation of infrastructure architecture for Big Data have been described in a language specific to structural features and/or methods, it is to be understood that the present subject matter is not necessarily limited to the specific features or methods described. Rather, the specific features and methods are disclosed as exemplary embodiments for modeling and simulation of infrastructure architecture for Big Data.

We claim:

1. An infrastructure modeling and simulation system for generating one or more architecture models for Big Data of an organization, the infrastructure modeling and simulation system comprising:
    a processor;
    an interaction module coupled to the processor to receive at least one user requirement and a set of model requirements from a user associated with the organization, wherein the set of model requirements is indicative of information relating to each of the one or more architecture models;
    a determination module to determine a Big Data framework for providing recommendation to the user, wherein the Big Data framework is determined based on the at least one user requirement;
    an architecture modeling engine coupled to the processor to generate the one or more architecture models for providing a recommendation to the user, wherein the one or more architecture models are generated based on the at least one user requirement and the set of model requirements, wherein the set of model requirements corresponds to information of a cluster architecture model, a network architecture model, a storage architecture model, and an information security architecture model;
    a performance simulator coupled to the processor to simulate the one or more architecture models to ascertain performance of each of the one or more architecture models based at least on a pre-defined specification of architecture components associated with each of the one or more architecture models from a database to demonstrate the performance of each of the one or more architecture models, wherein the performance simulator further displays the performance of each of the generated one or more architecture models to the user using pre-defined reporting templates retrieved from the database;
    a cost calculation module to calculate a cost associated with each of the generated one or more architecture models based on a pre-defined monetary price of each architecture component retrieved from the database;
    the architecture modeling engine further rendering the generated one or more architecture models to the user, the one or more architecture models being customized; and
    an interface enabling the infrastructure modeling and simulation system for communication with web servers and external repositories, wherein the infrastructure modeling and simulation system is deployed on a centralized infrastructure and used by multiple users in as-a-service mode.

2. The infrastructure modeling and simulation system as claimed in claim 1, wherein the one or more architecture models are three-dimensional (3D) models, wherein the network architecture model is scalable to a large number of servers and be fault tolerant against various types of network component failure, link outages, and server-rack failures.

3. The infrastructure modeling and simulation system as claimed in claim 1, wherein the at least one user requirement includes a domain of the organization, one or more use cases pertaining to the domain of the organization, a deployment environment for deployment of the one or more architecture models, an amount of data to be stored, a composition of the data, and a method of feeding the data.

4. The infrastructure modeling and simulation system as claimed in claim 1, wherein the set of model requirements include at least one cluster requirement, at least one network requirement, at least one storage requirement, and at least one security requirement.

5. The infrastructure modeling and simulation system as claimed in claim 4, wherein the at least one cluster requirement include an expected growth rate of data, a number of data sources, and input/output bandwidth; the at least one network requirement include network resiliency, burst handling and queue depth, network scalability, network capacity, and network latency; the at least one storage requirement include re-use of storage devices and reduction of power consumption by the storage devices; and the at least one security requirement include authentication and authorization while accessing data and a security level for the data.

6. The infrastructure modeling and simulation system as claimed in claim 1, wherein the Big Data framework corresponds to one of a Big Data technology, a NoSQL technology, and a combination of the Big Data technology and the NoSQL technology; and the Big Data framework recommends a product to the user corresponding to the Big Data framework.

7. The infrastructure modeling and simulation system as claimed in claim 6, wherein the Big Data technology comprises Hadoop and any of the NoSQL technologies.

8. A method for modeling and simulation of one or more architecture models for Big Data of an organization, the method comprising:
- receiving at least one user requirement from a user associated with the organization;
- determining a Big Data framework for providing a recommendation to the user, wherein the Big Data framework is determined based on the at least one user requirement;
- receiving at least a set of model requirements from a user associated with the organization, wherein the set of model requirements is indicative of information relating to the one or more architecture models;
- generating the one or more architecture models for providing a recommendation to the user, wherein the one or more architecture models are generated based on the at least one user requirement and the set of model requirements, wherein the set of model requirements corresponds to information of a cluster architecture model, a network architecture model, a storage architecture model, and an information security architecture model;
- simulating the one or more architecture models to ascertain performance of each of the one or more architecture models based at least on a pre-defined specification of architecture components associated with each of the one or more architecture models from a database to demonstrate the performance of each of the one or more architecture models, and further displaying the performance of each of the generated one or more architecture models to the user using pre-defined reporting templates retrieved from the database;
- calculating a cost associated with each of the generated one or more architecture models based on a pre-defined monetary price of each architecture component retrieved from the database;
- rendering the generated one or more architecture models to the user, the one or more architecture models being customized; and
- enabling the modeling and simulation of the one or more architecture models for communication with web servers and external repositories, wherein the infrastructure modeling and simulation system is deployed on a centralized infrastructure and used by multiple users in as-a-service mode.

9. The method as claimed in claim 8, wherein the Big Data framework corresponds to one of a Big Data technology, a NoSQL technology, and a combination of the Big Data technology and the NoSQL technology; the method further comprising:
- identifying a plurality of characteristics of an existing cluster in the organization to model and simulate an existing Big Data framework within the organization;
- adjusting one or more parameters pertaining to each of the one or more architecture models based on simulated performance of each of the one or more architecture models;
- defining characteristics of hardware products and infrastructure products for generating the one or more architecture models, simulating the one or more architecture models, and calculating the cost associated with the one or more architecture models and adapt new hardware products and infrastructure products; and
- feeding details of the generated one or more architecture models to an external system for physical implementation of the generated one or more architecture models.

10. The method as claimed in claim 8, wherein the one or more architecture models are three-dimensional (3D) models, wherein the network architecture model is scalable to a large number of servers and be fault tolerant against various types of network component failure, link outages, and server-rack failures.

11. The method as claimed in claim 8, wherein the set of model requirements include at least one cluster requirement, at least one network requirement, at least one storage requirement, and at least one security requirement.

12. The method as claimed in claim 8, wherein the at least one user requirement includes a domain of the organization, one or more use cases pertaining to the domain of the organization, a deployment environment for deployment of the one or more architecture models, an amount of data to be stored, a composition of the data, and a method of feeding the data.

13. A non-transitory computer-readable medium having embodied thereon a computer program for executing a method comprising:
- receiving at least one user requirement from a user associated with an organization;
- determining a Big Data framework for providing recommendation to the user, wherein the Big Data framework is determined based on the at least one user requirement;
- a set of model requirements from the user associated with an organization, wherein the set of model requirements is indicative of information relating to one or more architecture models;
- generating the one or more architecture models for providing a recommendation to the user, wherein the one or more architecture models are generated based on the at least one user requirement and the set of model requirements, wherein the set of model requirements corresponds to information of a cluster architecture model, a network architecture model, a storage architecture model, and an information security architecture model; and
- simulating the one or more architecture models to ascertain performance of each of the one or more architecture models based at least on a pre-defined specification of architecture components associated with each of the one or more architecture models from a database to demonstrate the performance of each of the one or more architecture models, and further displaying the performance of each of the generated one or more architecture models to the user using pre-defined reporting templates retrieved from the database;
- calculating a cost associated with each of the generated one or more architecture models based on a pre-defined monetary price of each architecture component retrieved from the database;
- rendering the generated one or more architecture models to the user, the one or more architecture models being customized; and
- enabling the modeling and simulation for communication with web servers and external repositories, wherein the infrastructure modeling and simulation system is deployed on a centralized infrastructure and used by multiple users in as-a-service mode.

14. The non-transitory computer-readable medium as claimed in claim 13, wherein the Big Data framework corresponding to one of a Big Data technology, a NoSQL technology, and a combination of the Big Data technology and the NoSQL technology;

wherein the non-transitory computer-readable medium further comprises:

identifying a plurality of characteristics of an existing cluster in the organization to model and simulate an existing Big Data framework within the organization;

adjusting one or more parameters pertaining to each of the one or more architecture models based on simulated performance of each of the one or more architecture models;

defining characteristics of hardware products and infrastructure products for generating the one or more architecture models, simulating the one or more architecture models, and calculating the cost associated with the one or more architecture models and adapt new hardware products and infrastructure products; and feeding details of the generated one or more architecture models to an external system for physical implementation of the generated one or more architecture models.

15. The non-transitory computer-readable medium as claimed in claim 13, wherein the one or more architecture models are three-dimensional (3D) models, wherein the network architecture model is scalable to a large number of servers and be fault tolerant against various types of network component failure, link outages, and server-rack failures.

16. The non-transitory computer-readable medium as claimed in claim 13, wherein the set of model requirements include at least one cluster requirement, at least one network requirement, at least one storage requirement, and at least one security requirement.

17. The non-transitory computer-readable medium as claimed in claim 13, wherein the at least one user requirement includes a domain of the organization, one or more use cases pertaining to the domain of the organization, a deployment environment for deployment of the one or more architecture models, an amount of data to be stored, a composition of the data, and a method of feeding the data.

* * * * *